(12) United States Patent
Kuhlman et al.

(10) Patent No.: US 8,279,510 B2
(45) Date of Patent: Oct. 2, 2012

(54) DUAL VIEW DISPLAY

(75) Inventors: Frederick F. Kuhlman, Kokomo, IN (US); Dwadasi H. R. Sarma, Kokomo, IN (US); Andrew P. Harbach, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 27 days.

(21) Appl. No.: 12/958,767

(22) Filed: Dec. 2, 2010

(65) Prior Publication Data
US 2012/0140304 A1    Jun. 7, 2012

(51) Int. Cl.
*G02B 26/02* (2006.01)
(52) U.S. Cl. ........................................................ 359/227
(58) Field of Classification Search .................. 359/227
See application file for complete search history.

(56) References Cited

U.S. PATENT DOCUMENTS

| | | | |
|---|---|---|---|
| 6,762,436 B1 | 7/2004 | Huang et al. | |
| 7,106,001 B2 | 9/2006 | Kim et al. | |
| 7,223,007 B1 | 5/2007 | Fredley et al. | |
| 2003/0227254 A1* | 12/2003 | Terumoto | 313/504 |
| 2004/0075628 A1 | 4/2004 | Chien et al. | |
| 2004/0212300 A1 | 10/2004 | Chao et al. | |
| 2006/0232204 A1 | 10/2006 | Hu | |
| 2007/0138941 A1 | 6/2007 | Jin et al. | |
| 2009/0231662 A1 | 9/2009 | Sorensson et al. | |

FOREIGN PATENT DOCUMENTS

| | | |
|---|---|---|
| EP | 1 801 881 | 6/2007 |
| WO | 2009/109814 | 9/2009 |

OTHER PUBLICATIONS

Zhou, et al.: "A full description of a simple and scalable fabrication process for electrowetting displays", Journal of Micromechanics and Microengineering, May 22, 2009, IOP Publishing, pp. 1-12.
U.S. Appl. No. 12/840,576, filed Jul. 21, 2010, entitled Dual Display System Using a Transparent Display.
European Search Report dated Dec. 29, 2011.

* cited by examiner

*Primary Examiner* — Euncha Cherry
(74) *Attorney, Agent, or Firm* — Lawrence D. Hazelton

(57) ABSTRACT

A dual view or two-sided display system to display two different images in substantially opposite direction using a single transparent display to time-multiplex the images and two shutter devices to alternately block each side from being viewed according to the image being displayed. The system includes reflective devices between each side of the transparent display and the two shutter devices so light can be reflected from one side of the transparent display to the other side of the transparent display in order to supplement the light intensity of the image being displayed.

5 Claims, 3 Drawing Sheets

DUAL VIEW DISPLAY

TECHNICAL FIELD OF INVENTION

The invention generally relates to dual view displays using opaque elements as light valves or shutter devices to display different images on opposite sides of the transparent display, and reflective elements to reflect light from one side of the display to the other side to increase the brightness of the image.

BACKGROUND OF INVENTION

Transparent panel type displays capable of being viewed from substantially opposite sides are known. For example, a transparent organic light emitting diode (OLED) type display naturally emits light from both sides of the display. Such displays are available from Samsung, NeoView Kolon, and others. While such displays may be viewed from either side, the image on one side is typically a mirror image or reverse image of the opposite side, and so makes the viewing images such as text or asymmetrical objects difficult for the person seeing the mirrored or reversed image. It has been proposed to include a shutter device on each side of the display so that the image displayed and the shutter devices could be multiplexed in order to display distinct images on each side of the display. However, such multiplexing may undesirably reduce the brightness of the distinct images viewed from each side.

SUMMARY OF THE INVENTION

In accordance with an embodiment of this invention, a dual view display system for displaying images formed of light in substantially opposite directions is provided. The system includes a transparent display, a first shutter device, and a first reflective device. The transparent display is configured to emit light from a first side in a first direction and emit light from a second side substantially opposite the first side in a second direction substantially opposite the first direction. The first shutter device overlays the first side of the transparent display. The first shutter device is operable to a transparent mode whereby light emitted in the first direction by the transparent display passes through the first shutter device, and operable to an opaque mode whereby light emitted in the first direction by the transparent display is obstructed from passing through the first shutter device. The first reflective device is interposed between the transparent display and the first shutter device. The first reflective device is operable to a transparent mode whereby light emitted in the first direction by the transparent display passes through the first reflective device toward the first shutter device, and operable to a reflective mode whereby light emitted in the first direction by the transparent display is reflected through the transparent display into the second direction. By this arrangement, the reflected light supplements light emitted in the second direction by the transparent display.

Further features and advantages of the invention will appear more clearly on a reading of the following detailed description of the preferred embodiment of the invention, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION OF INVENTION

Figure 1:
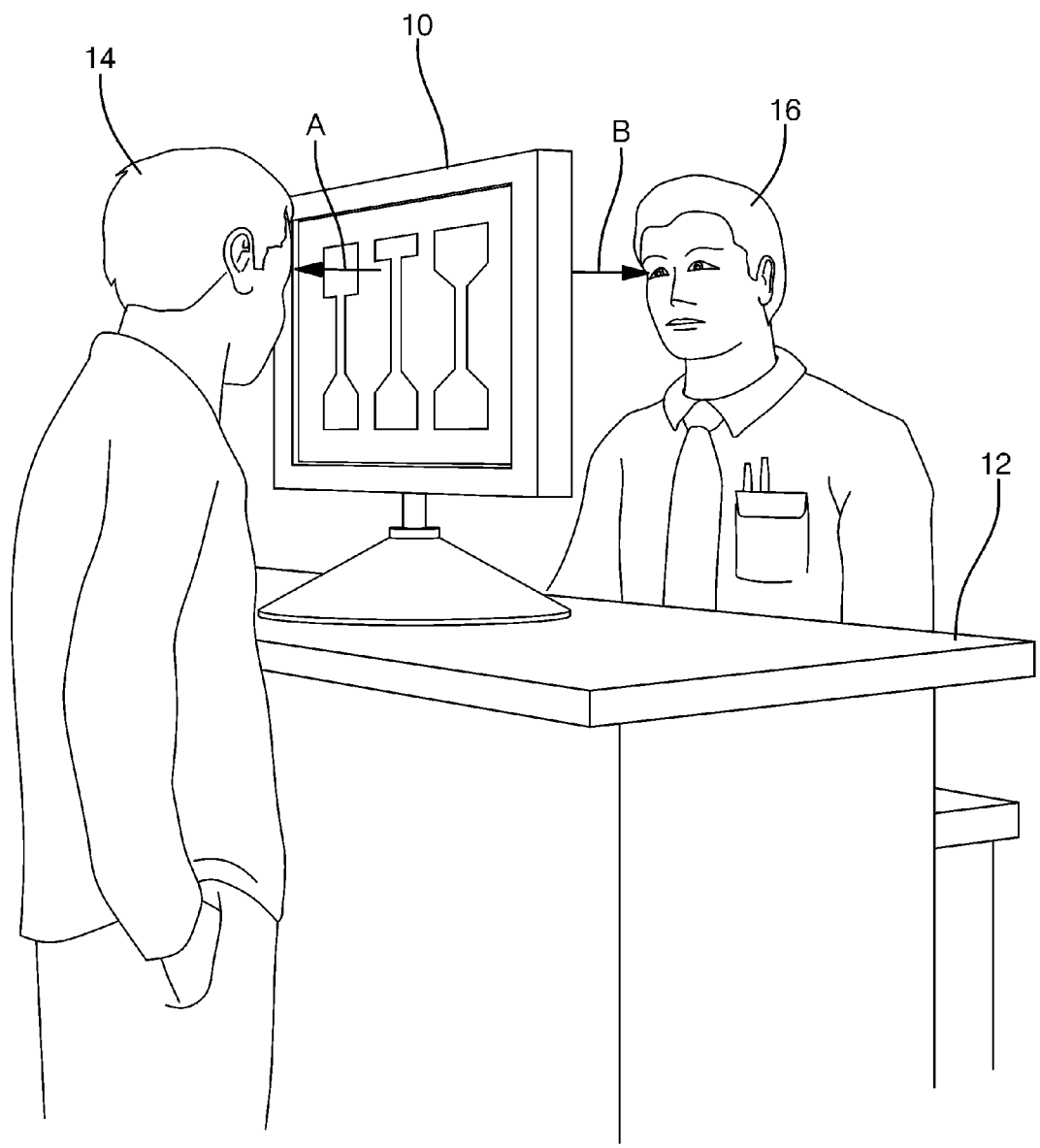
FIG. 1 is a perspective view of an exemplary service counter equipped with a dual view display system in accordance with an embodiment.

In accordance with an embodiment of a dual view display system 10 for displaying properly oriented images in substantially opposite directions A and B, FIG. 1 illustrates a non-limiting example of the system 10 positioned on a service counter 12 at a retail store, for example an automotive parts store. As used herein, displaying properly oriented images means that the dual view display system 10 includes features to overcome the problem of the images on the opposite sides of the transparent display being reversed or mirror images of each other, as will be described in more detail below. The system 10 is configured so that, as illustrated in this example, a customer 14 and a sales person 16 can view information from opposite direction A and B on opposite sides of the dual view display system 10. In some instances, it may be desirable for the customer 14 to view the same information that is viewed by the sales person 16, for example to identify an automotive part the customer 14 wants to purchase. Positioning the dual view display system 10 so that the customer 14 and sales person 16 are both provided with a convenient display avoids inconveniences such as having to share a single view display by swiveling the display back and forth between directions A and B, or the customer 14 and sales person 16 having to lean over the counter 12 toward each other so both can view the single view display from a direction somewhere between directions A and B. Furthermore, it may be desirable for the information on the display viewed by the customer 14 to be a subset of the information on the display viewed by the sales person 16, such as a zoomed in image of an automotive part, or the image displayed to the customer 14 not showing part numbers or stocking information that may be shown to the sales person 16. Other situations where the dual view display system 10 may be useful include displaying to customers (not shown) unrelated information on opposite sides of a retail display such as adjacent isles in a grocery store, or displaying gaming information to opponents (not shown) competing in an interactive video game. It should be apparent that such a dual view display system 10 will be useful to display information to individuals that are interacting in numerous ways or in situations where there is no interaction between the persons viewing the opposite sides of the dual view display system 10.

Figure 2:
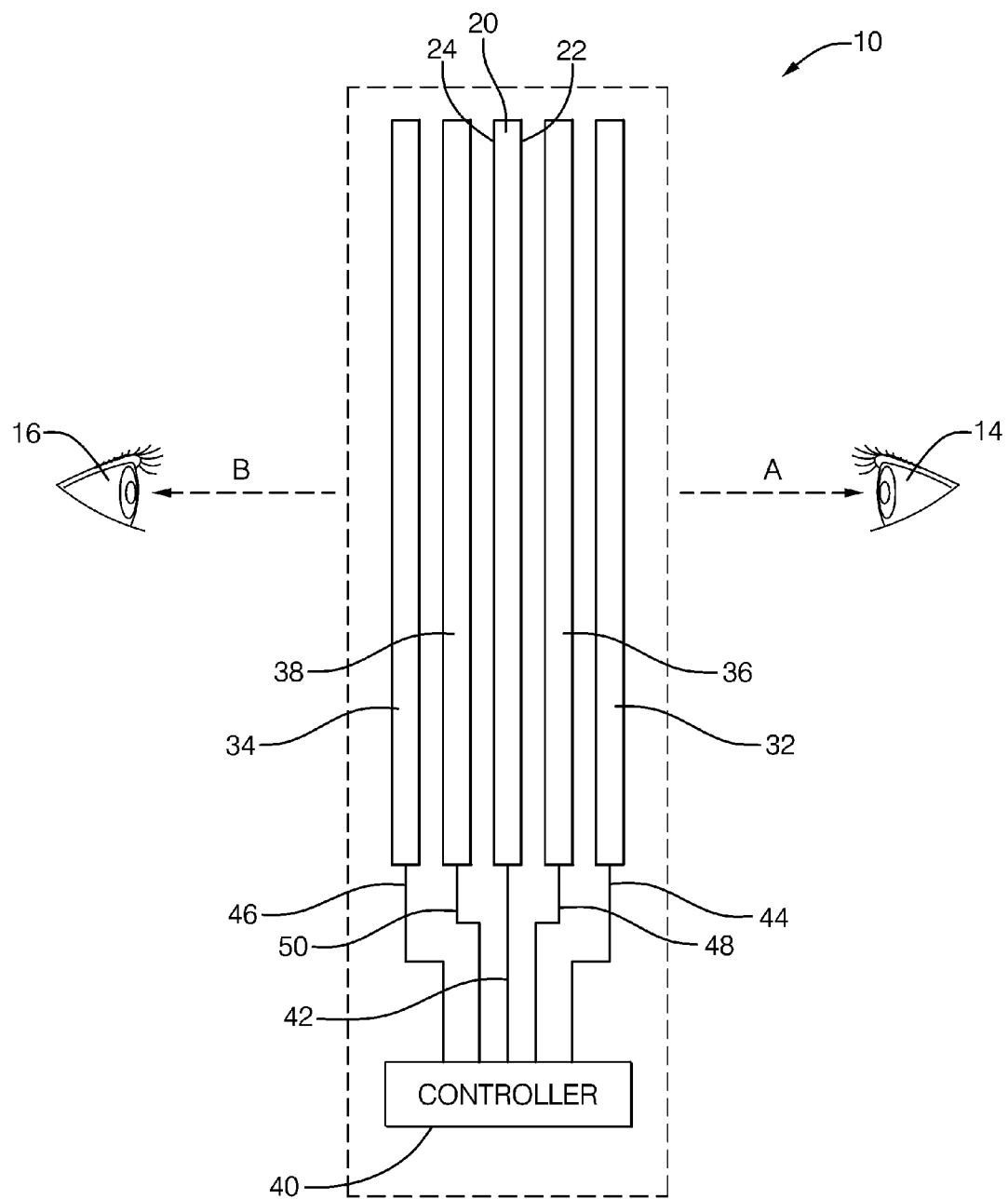
FIG. 2 is a diagram of a dual view display system for use with in the dual display system of FIG. 1 in accordance with one embodiment.

FIG. 2 shows a diagram of an embodiment of a dual view display system 10 configured to display a first image in a direction A, and a second image in a second direction B. The first image is preferably oriented for viewing from a first side 22 of the transparent display 20, and the second image is preferably oriented for viewing from a second side 24. By displaying distinct images on opposite sides, the dual view display system 10 may be configured to display distinct images in substantially opposite directions A and B. Providing such a feature may include time-multiplexing the images. Time-multiplexing may include the transparent display 20 displaying a first image oriented for viewing on the first side 22 from the first direction A during a first time period and displaying a second image oriented for viewing on a second side 24 opposite the first side 22 from a second direction B substantially opposite the first direction A during a second time period distinct from the first time period. As used herein, substantially opposite directions A and B means that images are viewed from positions on opposite sides of a plane defined by the dual view display system 10.

To control the viewing of the images on the transparent display 20 such that the images appear to be properly oriented, the dual view display system 10 may include a first shutter device 32 configured to allow a view of the first side 22 of the transparent display 20 from the first direction A during the first time period, and to block or obstruct the view of the first side 22 during the second time period. The dual view display system 10 may also include a second shutter device 34 configured to allow a view of the second side 24 of the transparent display from the second direction B during the second time period, and block the view of the second side 24 during the first time period. The shutter devices 32 and 34 are operated as light valves to transmit or block the propagation of light. For example, the first shutter device 32 may overlay the first side 22 of the transparent display 20. Also, first shutter device 32 may be operable to a transparent mode whereby light emitted in the first direction A by the transparent display 20 passes through the first shutter device 32, and also be operable to an opaque mode whereby light emitted in the first direction A by the transparent display 20 is obstructed from passing through the first shutter device 32. The second shutter device may be similarly operable.

The dual view display system 10 may also include a first reflective device 36 interposed between the transparent display 20 and the first shutter device 32. The first reflective device 36 may be operable to a transparent mode whereby light emitted in the first direction A by the transparent display passes through the first reflective device 36 toward, and possibly through, the first shutter device. The first reflective device 36 may also be operable to a reflective mode whereby light emitted toward the first direction A by the transparent display 20 is reflected by the first reflected device 36 back through the transparent display 20 and into the second direction B as illustrated by the upside-down U shaped arrows in FIG. 3. When the first reflective device 36 is in the reflective mode, light emitted from the first side 22 is reflected by the first reflective device 36 back through the transparent display 20 and so adds to or supplements light emitted fro the second side 24 so that the image emitted in direction B is brighter, e.g. has increased light intensity, than an image that is only formed by light from the second side 24. With such an arrangement, the dual view display can vary the brightness of the image shown on either side of the dual view display. By way of further explanation, if it is desired that the image have a brightness that is between that which occurs when no light is reflected from the opposite side being viewed, and that which occurs when all of the light is reflected from the opposite side, the reflective device may be operable to reflect a portion of the light, and so the a shutter device is necessary so that the un-reflected portion of the light is not seen on the opposite side of the dual view display. It will be appreciated that the reflective devices 36 and 38 will recover at least some of the image brightness lost by multiplexing the image displayed on each side of the dual view display 10

FIG. 2 shows the devices 32, 34, 36, and 38 spaced apart from the transparent display 20 for the purposes of illustration. It will be recognized by those skilled in the art that the transparent display 20 and the devices may be in intimate contact and so minimize the thickness of the dual view display system 10. Furthermore, it will be recognized that having the devices in contact, possibly sharing layers of glass as suggested in FIG. 3, or sharing electrode connections, would be advantageous both for reasons manufacturing economy and light transmission efficiency.

Figure 3:
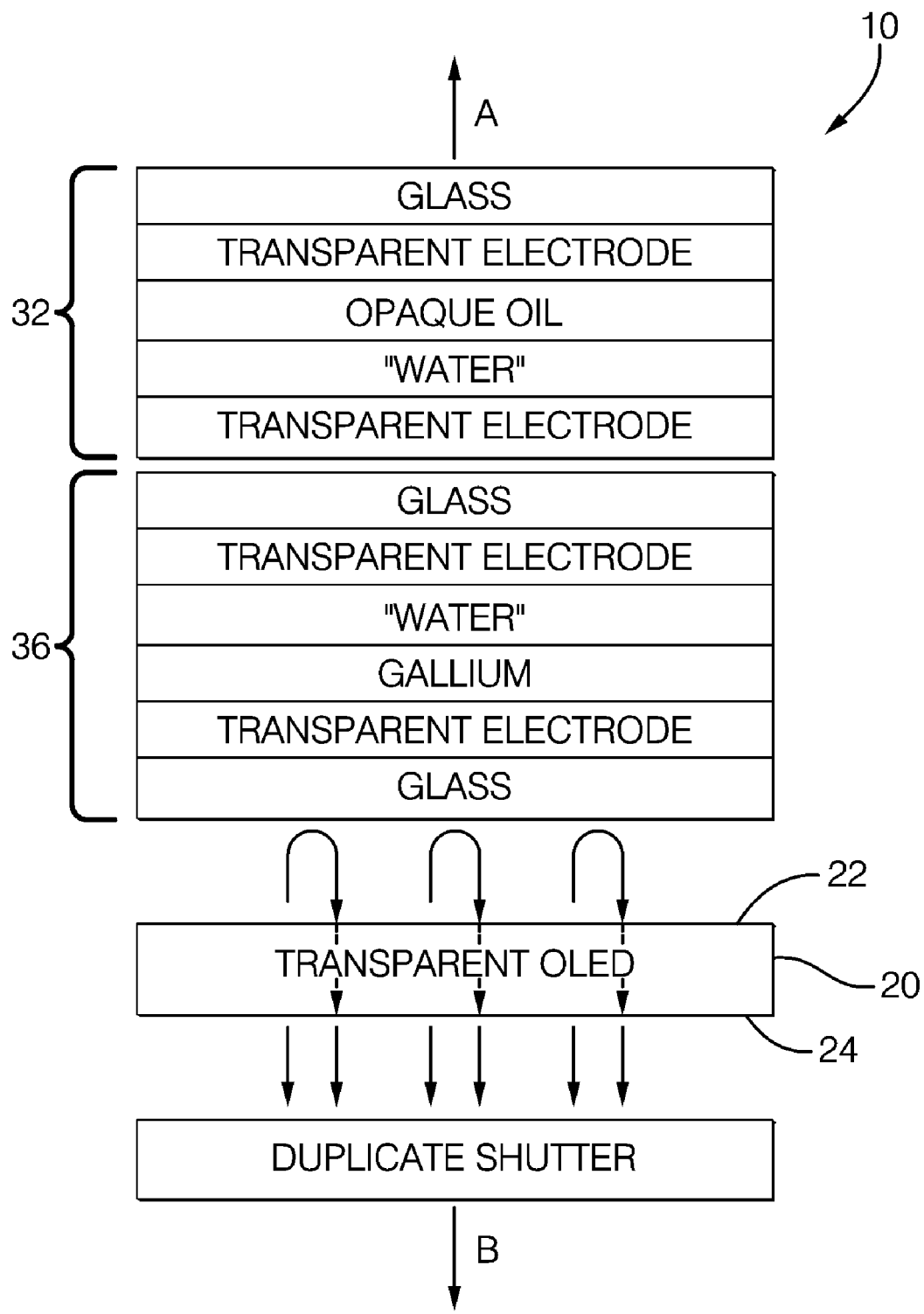
FIG. 3 is a side view of a dual view display system for use with in the dual display system of FIG. 1 in accordance with one embodiment.

The transparent display 20 as being flat, however is will be recognized that since flexible transparent displays are available, the dual view display system 10 may be curved or otherwise shaped for applications where a non-flat display would be advantageous. FIG. 1-3 also depict the display areas on opposite sides of the dual view display system 10 as being about equal, however it will be appreciated that the display area on one side could be different that the display area on the other side.

FIG. 3 illustrates an embodiment of the dual view display 10. As illustrated, the transparent display 20 may include or be formed of an array of organic light emitting diodes (OLED). Other type of displays such as liquid crystal displays (LCD) and Electroluminescent displays may also be suitable for use as the transparent display 20.

In an embodiment of the dual view display 10, the first shutter device 32 and/or the second shutter device 34 may include or be formed of an electrowetting element that includes an opaque layer or opaque oil layer. Alternately, the shutter devices 32, 34 may be a liquid crystal device (LCD) that is known in the display arts. In another embodiment of the dual view display 10, the first reflective device 36 and/or the second reflective device 38 may include or be formed of an electrowetting element that includes a gallium allow layer such as a gallium-indium-tin layer commonly known as Galistan. FIG. 3 illustrates a typical structure for a first shutter device 32 and a first reflective device 34 based on electrowetting technology. As illustrated in FIG. 3, the first shutter device 32 and first reflective device 36 are closely coupled, possibly in intimate or bonded contact. Alternately, the shutter and reflective devices could be further integrated, for example by sharing a common electrode by, for example, eliminating the glass layer at the top of the first reflective element 36 so a single transparent electrode is between the two electrowetting "water" layers Referring again to FIG. 2, the system 10 may include a controller 40 adapted to provide an image control signal 42 for controlling the time-multiplexing of images shown by the transparent display 20. The controller 40 may also be adapted to provide a first shutter control signal 44 for controlling the first shutter device 32, a second shutter control signal 46 for controlling the second shutter device 34, a first reflective control signal 48, and a second reflective control signal 50 in coordination with the images being displayed by the transparent display 20. The controller 40 may include a processor such as a microprocessor or other control circuitry as should be evident to those in the art. The controller 40 may include memory, including non-volatile memory, such as electrically erasable programmable read-only memory (EEPROM) for storing one or more routines, thresholds and captured data. The one or more routines may be executed by the processor to perform steps for providing signals 42, 44, 46, 48, and 50 as described herein.

The control signals 42, 44, 46, 48, and 50 are shown as independent signals since it may be desirable to provide a delay time between one shutter device switching from the transparent state (OFF) to the opaque state (ON) and the other shutter device switching from ON to OFF. This delay time may be desirable so the transparent display 20 can completely update the image before a shutter device is turned OFF so the image can be viewed. Alternatively, the shutter control signals 44 and 46 may be combined into a single signal and any necessary time delays be provided by the shutter devices 32 and 34.

It may also be desirable in some instances for both shutter devices and both reflective devices to be turned off so the transparent display can be viewed from both sides simultaneously, even though the view from the first direction A is a mirror image of the view from the second direction B. Such a mode of operation may be useful so one viewer can determine if some detail being displayed is being pointed to by the other viewer. Referring FIG. 1, in such a mode of operation, the customer 14 would see a mirror image of what is seen by the sales person 16.

FIG. 3 illustrates an exemplary embodiment of the dual view display system 10 displaying a first image in direction A from the first side 22 of the transparent display 20 as viewed through the first shutter device 32 and the first reflective device 36, and displaying a second image in direction B from the second side 24 of the transparent display 20 as viewed a duplicate shutter understood to be a mirror image duplication of the first shutter device 32 and the first reflective device 36. As suggested by the U shaped arrows, light emitted from the first side 22 is reflected by the first reflective device 36 and so combines with light emitted from the second side 24 to provide an image in direction B that is brighter than would be the case if the image displayed in direction B was only formed of light emitted from the second side 24.

Accordingly, a dual view display system 10 for displaying properly oriented images in substantially opposite directions is provided. By using a single transparent display 20 and two shutter devices 32 and 34, a system 10 displaying two distinct images is provided for less cost than two separate displays. It will be appreciated that such a system 10 that displays images in substantially opposite directions may be useful for many situations where two persons are interacting while viewing related images, such as when competing with a video game, or explaining what is shown by a medical image (e.g. x-ray, CAT scan). Furthermore, the dual view display system 10 may be equipped with reflective devices 36 and 38 to enable variable brightness control of the image and to recover some all of the image brightness lost due to the time multiplexing if the images.

While this invention has been described in terms of the preferred embodiments thereof, it is not intended to be so limited, but rather only to the extent set forth in the claims that follow.

We claim:

1. A dual view display system for displaying images formed of light in substantially opposite directions, said system comprising:
   a transparent display configured to emit light from a first side in a first direction and emit light from a second side substantially opposite the first side in a second direction substantially opposite the first direction;
   a first shutter device overlying the first side of the transparent display, said first shutter device operable to a transparent mode whereby light emitted in the first direction by the transparent display passes through the first shutter device, and operable to an opaque mode whereby light emitted in the first direction by the transparent display is obstructed from passing through the first shutter device; and
   a first reflective device interposed between the transparent display and the first shutter device, said first reflective device operable to a transparent mode whereby light emitted in the first direction by the transparent display passes through the first reflective device toward the first shutter device, and operable to a reflective mode whereby light emitted in the first direction by the transparent display is reflected through the transparent display into the second direction, thereby supplementing light emitted in the second direction by the transparent display.

2. The system in accordance with claim 1, wherein said transparent display comprises an organic light emitting diode (OLED).

3. The system in accordance with claim 1, wherein said first shutter device comprises an electrowetting element that includes an opaque oil layer.

4. The system in accordance with claim 1, wherein said first reflective device comprises an electrowetting element that includes a Galistan layer.

5. The system in accordance with claim 1, wherein said system further comprises
   a second shutter device overlying the second side of the transparent display; and
   a second reflective device interposed between the transparent display and the second shutter device.

* * * * *